United States Patent
Eshel

(10) Patent No.: US 6,459,620 B1
(45) Date of Patent: Oct. 1, 2002

(54) SENSE AMPLIFIER OFFSET CANCELLATION IN NON-VOLATILE MEMORY CIRCUITS BY DEDICATED PROGRAMMED REFERENCE NON-VOLATILE MEMORY CELLS

(75) Inventor: Noam Eshel, Pardesiya (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/888,348

(22) Filed: Jun. 21, 2001

(51) Int. Cl.$^7$ ............................................... G11C 16/06
(52) U.S. Cl. .............................. 365/185.21; 365/185.2; 365/185.24
(58) Field of Search ..................... 365/185.2, 185.21, 365/185.22, 185.24, 210

(56) References Cited

U.S. PATENT DOCUMENTS

| | | | |
|---|---|---|---|
| 5,157,626 A | 10/1992 | Watanabe | |
| 5,694,363 A | * 12/1997 | Calligaro et al. | ........... 365/208 |
| 5,812,456 A | 9/1998 | Hull et al. | |
| 6,128,226 A | 10/2000 | Eitan et al. | |
| 6,292,397 B1 | * 9/2001 | Kim | ......................... 365/185.2 |

* cited by examiner

Primary Examiner—Son Mai
(74) Attorney, Agent, or Firm—E. Eric Hoffman; Bever, Hoffman & Harms, LLP

(57) ABSTRACT

A non-volatile memory (NVM) system including an array of NVM cells, a column decoder, a set of comparators and a corresponding set of NVM reference blocks is provided. During a read operation, the column decoder routes a set of read output voltages from an addressed set of the NVM cells. Each of the read output voltages is applied to a first input terminal of a corresponding comparator. Each NVM reference block generates a distinct reference voltage that is applied to a second input terminal of a corresponding comparator. Each NVM reference block is programmed to generate its distinct reference voltage in response to a random internal offset voltage in the corresponding comparator. Compensating the reference voltages in this manner enables all comparators to provide consistent results during a read operation.

9 Claims, 3 Drawing Sheets

SENSE AMPLIFIER OFFSET CANCELLATION IN NON-VOLATILE MEMORY CIRCUITS BY DEDICATED PROGRAMMED REFERENCE NON-VOLATILE MEMORY CELLS

FIELD OF THE INVENTION

The present invention relates to sense amplifier circuits used to detect the states of non-volatile memory cells in a non-volatile memory array.

BACKGROUND OF THE INVENTION

Non-volatile memory (NVM) systems typically sense the content of a non-volatile memory cell by comparing the current through the cell (or the voltage derived from the current through the cell) to a reference current (or voltage). When the sensed current (or voltage) is larger than the reference current (or voltage), the cell is considered to be erased. If the sensed current (or voltage) is smaller than the reference current (or voltage), the cell is considered to be programmed.

The reference current (or voltage) is typically generated by applying read voltages to a reference non-volatile memory cell. The reference cell is programmed to have a desired reference threshold voltage during the production of the non-volatile memory system. As a result, the reference cell will provide a reference voltage representative of the reference threshold voltage. The most common method for controlling the programming of the threshold voltage of the reference cell is to read the current through the reference cell as the reference cell is being programmed.

FIG. 1 is a circuit diagram of a portion of a conventional non-volatile memory system 100. NVM system 100 includes a reference voltage generation circuit 101, non-volatile memory array sections 110–111 and comparators 130–131. NVM array section 110 includes a plurality of NVM cells, including NVM cell 120, and access multiplexers 107–108. Similarly, NVM array section 111 includes a plurality of NVM cells, including NVM cell 121, and access multiplexers 105–106.

A read operation is performed as follows in NVM system 100. Within NVM array section 110, a first non-volatile memory cell 120 is selected to have a read word line voltage $V_{RWL}$ applied to its gate, a read bit line voltage $V_{RBL}$ applied to its source through multiplexer 107, and its drain coupled to the signal input terminal (SIG) of comparator 130 through multiplexer 108. The voltage applied to the SIG input terminal of comparator 130 is labeled as comparator input signal CI[0].

Similarly, within NVM array section 111, a second non-volatile memory cell 121 is selected to have the read word line voltage $V_{RWL}$ applied to its gate, the read bit line voltage $V_{RBL}$ applied to its source through multiplexer 105, and its drain coupled to the signal input terminal (SIG) of comparator 131 through multiplexer 106. The voltage applied to the SIG input terminal of comparator 131 is labeled as comparator input signal CI[1].

Reference voltage generation circuit 101 includes a reference non-volatile memory cell 102 and access multiplexers 103–104. Multiplexers 103–104 are designed to have the same electrical characteristics as corresponding multiplexers 105–106 and 107–108 in NVM array sections 110 and 111. During a read operation, the read bit line voltage $V_{RBL}$ is applied to the source of NVM reference cell 102 through multiplexer 103, and the read word line voltage $V_{RWL}$ is applied to the gate of NVM reference cell 102. In response, a current (which is dependent on the previously programmed threshold voltage of reference cell 102) flows through reference cell 102. This current is routed through multiplexer 104, and results in a reference voltage $V_{TREF}$, which is applied to the reference input terminals (REF) of comparators 130 and 131.

Comparators 130 and 131 experience random internal voltage offsets for various reasons, including device geometry mismatches and process fluctuations. Consequently, comparators 130 and 131 can be represented as ideal comparators 140 and 141, respectively, having internal voltage offsets 150 and 151, respectively. Internal voltage offset 150 has a value of $V_{OFF[0]}$, and internal voltage offset 151 has a value of $V_{OFF[1]}$. Because these internal voltage offsets 150–151 are random, it is likely that $V_{OFF[0]}$ is not equal to $V_{OFF[1]}$.

In view of voltage offsets 150 and 151, the voltages applied to the REF input terminals of ideal comparators 140 and 141 are equal to $(V_{TREF}+V_{OFF[0]})$ and $(V_{TREF}+V_{OFF[1]})$, respectively. Because ideal comparators 140–141 operate in response to different reference voltages, these ideal comparators 140–141 are subject to inaccuracies. For example, a CI[0] signal having a first voltage may cause comparator 130 to provide a logic high BIT[0] output signal, while a CI[1] signal having the same first voltage may cause comparator 131 to provide a logic low BIT[1] signal.

It would therefore be desirable to have a nonvolatile memory system that overcomes the above-described deficiencies of NVM system 100.

SUMMARY

Accordingly, the present invention provides a non-volatile memory system that includes a dedicated NVM reference circuit coupled to each comparator. Each NVM reference circuit includes a NVM reference cell, which is initially programmed to have a threshold voltage that compensates for the internal voltage offset of the corresponding comparator. Compensating the NVM reference circuits in this manner enables all of the comparators to provide consistent results during a read operation.

In one embodiment, each of the NVM reference cells is programmed in the following manner. A first programming pulse is applied to the NVM reference cell. This first programming pulse has a relatively low programming voltage and a relatively short duration, such that the NVM reference cell is not fully programmed. The NVM reference cell is then subjected to a read verify condition, whereby a voltage representative of the programmed threshold voltage of the NVM reference cell is applied to the reference input terminal of the corresponding comparator. During the read verify operation, a predetermined reference voltage $V_{REF}$ is applied to the signal input terminal of the corresponding comparator. The predetermined reference voltage $V_{REF}$ is a voltage selected to differentiate between a logic high read output voltage and a logic low read output voltage.

If the comparator indicates that the voltage applied to the reference input terminal is less than the predetermined reference voltage $V_{REF}$ applied to the signal input terminal, then another programming pulse, having a slightly higher programming voltage, is applied to the NVM reference cell, and another read verify operation is performed.

This process continues until the comparator indicates that the voltage applied to the reference input terminal is greater than the predetermined reference voltage $V_{REF}$ during the read verify operation. At this time, the programming operation is stopped.

In this manner, the threshold voltage of the NVM reference cell is programmed such that when the NVM reference cell is subjected to read conditions, the voltage applied to the reference input terminal of the comparator will be equal to the predetermined reference voltage $V_{REF}$, minus the offset voltage of the comparator. By programming the NVM reference cells in this manner, each of the NVM reference cells is properly referenced to the same predetermined reference voltage during subsequent read operation.

The present invention will be more fully understood in view of the following description and drawings.

DETAILED DESCRIPTION

Figure 1:
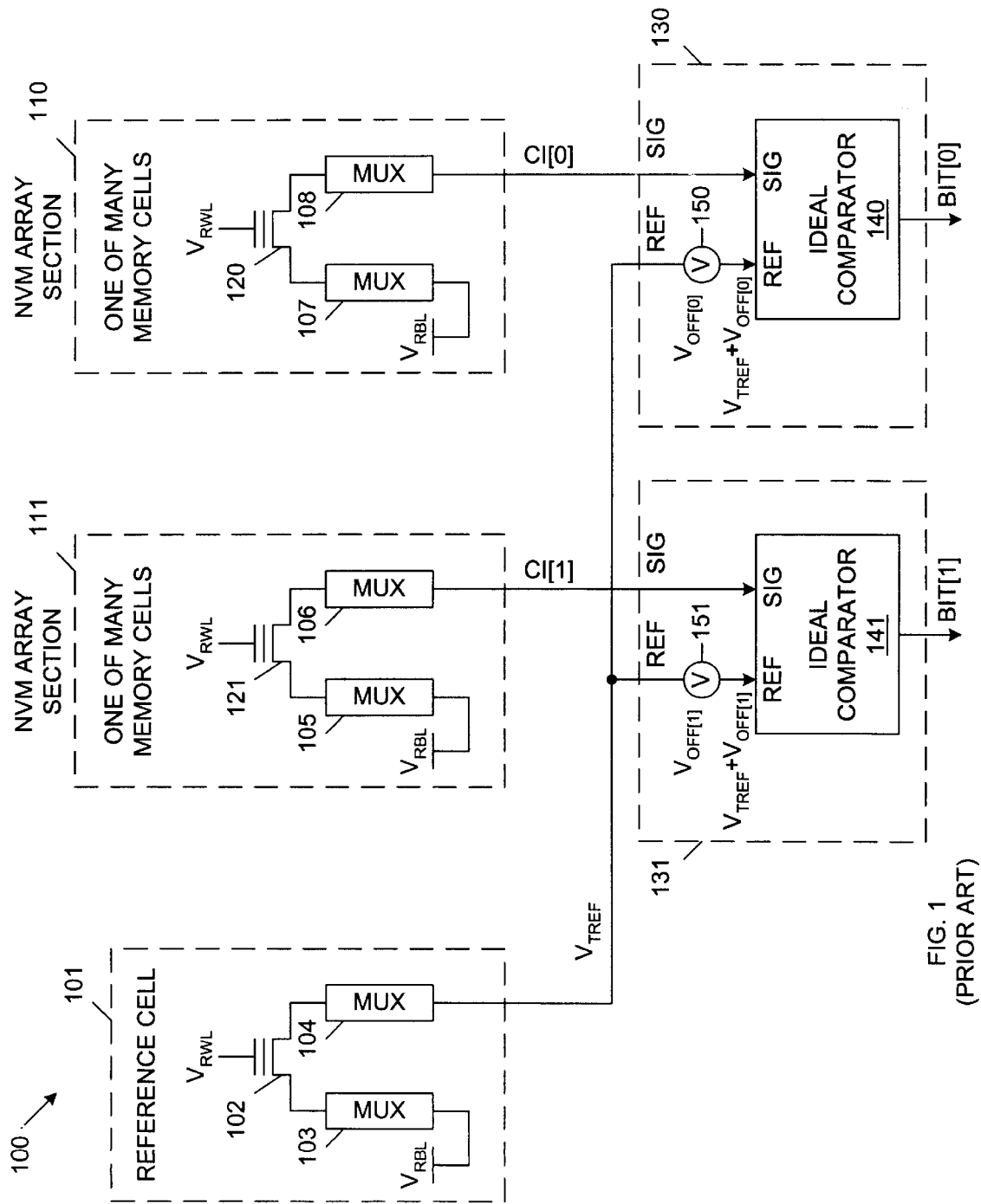
FIG. 1 is a circuit diagram of a portion of a conventional non-volatile memory system.
Figure 2:
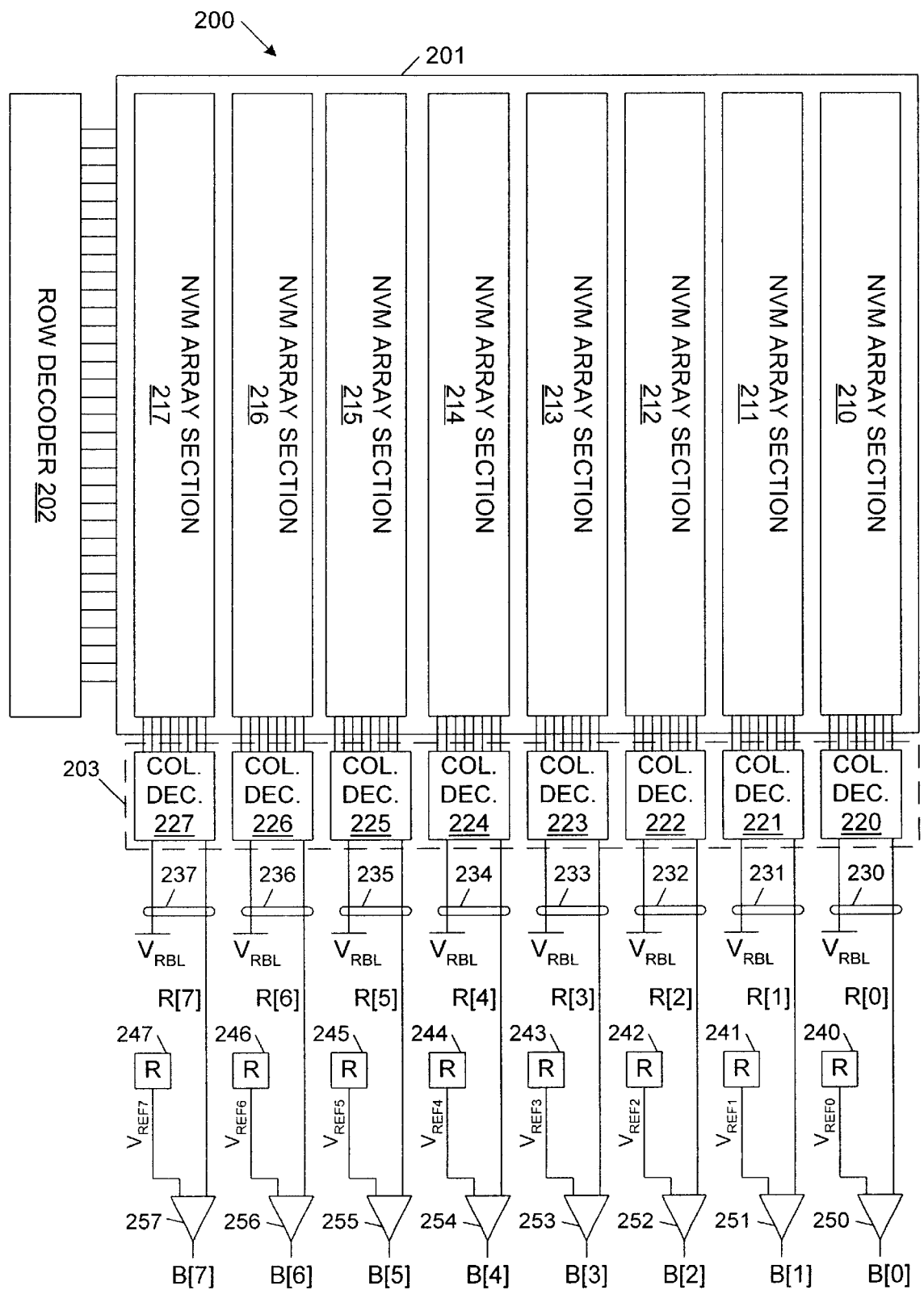
FIG. 2 is a block diagram of a non-volatile memory system in accordance with one embodiment of the present invention.

FIG. 2 is a circuit diagram of a non-volatile memory system 200 in accordance with one embodiment of the present invention. NVM system 200 includes an array of non-volatile memory cells 201, row decoder 202, column decoder 203 (which includes column decoder blocks 220–227), bit line pairs 230–237, non-volatile memory reference blocks 240–247, and comparators 250–257. NVM array 201 includes eight NVM array sections 210–217. In the described example, each of NVM array sections 210–217 includes 32 rows and eight columns of memory cells. Thirty-two word lines therefore extend between row decoder 202 and each of the NVM array sections 210–217. Row decoder 202 asserts a word line read voltage $V_{RWL}$ on one of the thirty-two word lines in response to a row address provided for a read operation.

Eight bit line pairs extend between each of NVM array sections 210–217 and column decoder blocks 220–227, respectively. Each of column decoder blocks 220–227 couples one of its eight received bit line pairs to bit line pairs 230–237, respectively, in response to a column address provided for a read operation. One of the bit lines in each of bit line pairs 230–237 is coupled to receive a bit line read voltage $V_{RBL}$ during a read operation. The other bit lines in bit line pairs 230–237 are coupled to the signal input terminals of comparators 250–257, respectively. The reference input terminals of comparators 250–257 are coupled to receive reference voltage signals $V_{REF0}$–$V_{REF7}$, respectively, from NVM reference blocks 240–247, respectively. In response, comparators 250–257 provide output bits B[0]–B[7], respectively. Note that each of comparators 250–257 has a dedicated NVM reference block 240–247. As described in more detail below, each of the NVM reference blocks 240–247 is programmed in response to the internal voltage offsets present in the corresponding one of comparators 250–257.

Although the present invention is described using an array 201 having a particular size and configuration, it is understood that the invention is not limited to this size or configuration. One of ordinary skill in the art would be capable of creating arrays having different sizes and configurations in view of the description provided herein.

Figure 3:
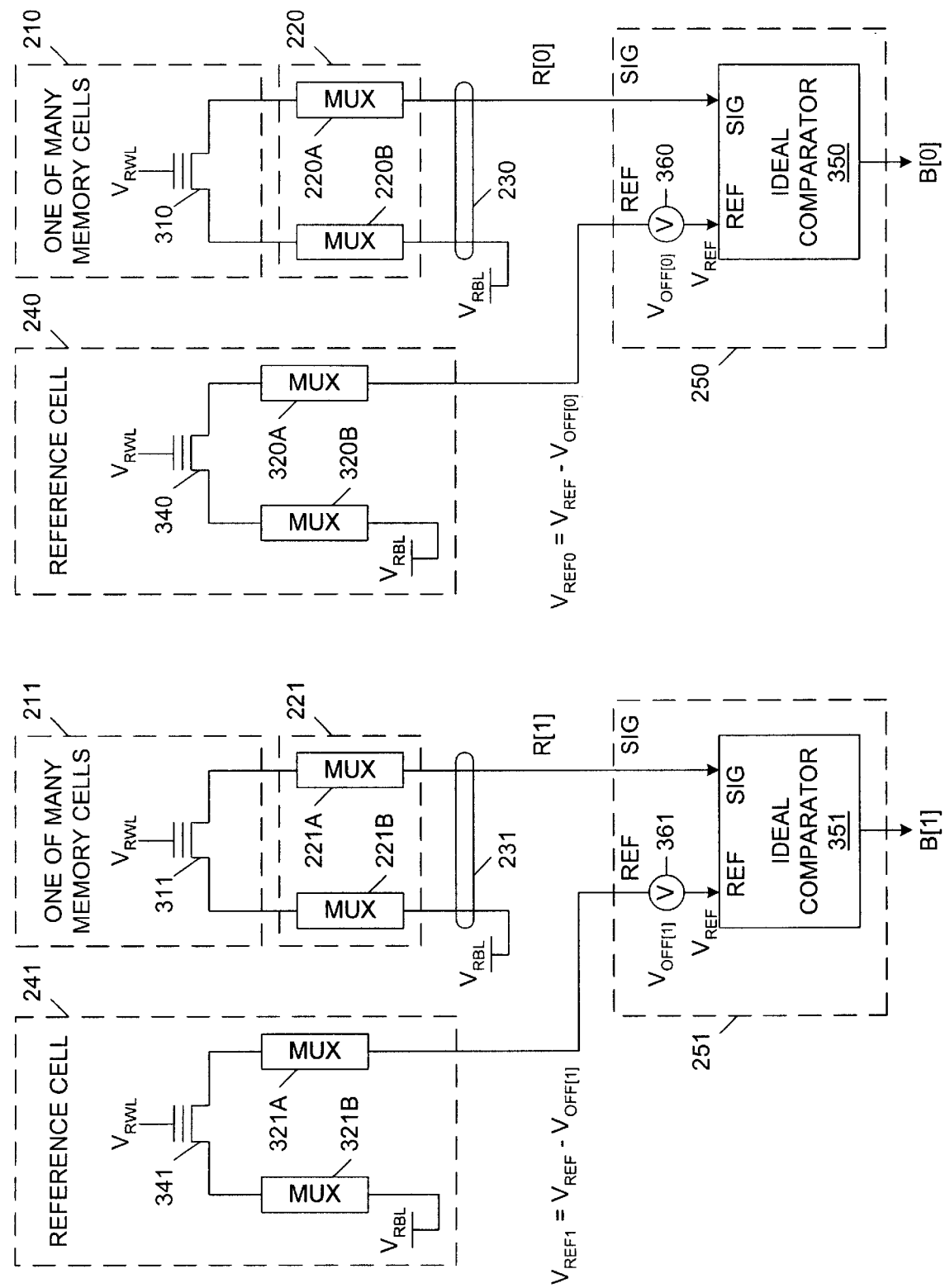
FIG. 3 is a circuit diagram of a portion of the non-volatile memory system of FIG. 2 in accordance with one embodiment of the present invention.

FIG. 3 is a circuit diagram illustrating a portion of NVM system 200 used to generate the two least significant read bits B[1:0] in accordance with one embodiment of the present invention. More specifically, FIG. 3 illustrates portions of NVM array sections 210–211, portions of column decoder blocks 220–221, bit line pairs 230–231, NVM reference blocks 240–241 and comparators 250–251.

NVM array sections 210 and 211 include NVM cells 310 and 311, respectively. Column decoder blocks 220 and 221 include multiplexer paths 220A–220B and 221A–221B, respectively. NVM reference blocks 240 and 241 include NVM reference cells 340 and 341, respectively, and multiplexer paths 320A–320B and 321A–321B, respectively. Comparators 250 and 251 include random offset voltages, and are therefore modeled as ideal comparators 350 and 351, respectively, which include random voltage offsets 360 and 361, respectively. Voltage offset 360 has a value of $V_{OFF[0]}$, and voltage offset 361 has a value of $V_{OFF[1]}$.

During a read operation, row decoder 202 applies a read word line voltage $V_{RWL}$ to one of the rows of NVM cells in NVM array 201 in response to a read address. In the described example, NVM cells 310 and 311 are in the row that receives the read word line voltage $V_{RWL}$.

Also in the described example, column decoder blocks 220 and 221 couple NVM cells 310 and 311 to bit line pairs 230 and 231, respectively, in response to the read address. Thus, the drain of NVM cell 310 is coupled to the signal input terminal (SIG) of comparator 250 through multiplexer path 220A in column decoder block 220. The source of NVM cell 310 is coupled to receive the read bit line voltage $V_{RBL}$ through multiplexer path 220B in column decoder block 220. Column decoder block 220 is configured such that multiplexer paths 220A–220B exhibit the same electrical characteristics as other multiplexer paths (not shown) in column decoder block 220, which provide connections to other columns of NVM cells in NVM array section 210.

Similarly, the drain of NVM cell 311 is coupled to the signal input terminal (SIG) of comparator 251 through multiplexer path 221A in column decoder block 221. The source of NVM cell 311 is coupled to receive the read bit line voltage $V_{RBL}$ through multiplexer path 221B in column decoder 221. Column decoder block 221 is configured such that multiplexer paths 221A–221B exhibit the same electrical characteristics as other multiplexer paths (not shown) in column decoder block 221, which provide connections to other columns of NVM cells in NVM array section 211.

Read currents will flow through NVM cells 310 and 311 under the above-described read conditions. These read currents will have particular levels, depending on the previously programmed threshold voltages of NVM cells 310 and 311 (i.e., whether NVM cells 310 and 311 are in programmed or erased states). In response to these read currents, output read voltage signals R[0] and R[1] are developed on the bit lines coupled to the SIG input terminals of comparators 250 and 251, respectively.

NVM reference block 240 includes NVM reference cell 340 and multiplexer paths 320A–320B. Similarly, NVM reference block 241 includes NVM reference cell 341 and multiplexer paths 321A–321B. In the described embodiment, NVM reference cells 340 and 341 are identical to NVM cells 310, 311, and all of the other NVM cells in array 201. However, as described below, NVM reference cells 340 and 341 are initially independently programmed to threshold voltages that are determined in view of voltage offsets 360 and 361 present in comparators 250 and 251, respectively.

During a read operation, the gates of NVM reference cells 340 and 341 are coupled to receive the read word line voltage $V_{RWL}$. In addition, the source of NVM reference cell 340 is coupled to receive the read bit line voltage $V_{RBL}$ through multiplexer path 320B, and the source of NVM reference cell 341 is coupled to receive the read bit line voltage $V_{RBL}$ through multiplexer path 321B. The drain of NVM reference cell 340 is coupled to the reference input terminal (REF) of comparator 250 through multiplexer path 320A. Similarly, the drain of NVM reference cell 341 is coupled to the reference input terminal (REF) of comparator 251 through multiplexer path 321A. Multiplexer paths 320A–320B and 321A–321B are selected to have the same electrical characteristics as multiplexer paths 220A–220B and 221A–221B, respectively.

Reference currents flow through NVM reference cells 340 and 341 under the above-described conditions. As a result, reference voltages $V_{REF0}$ and $V_{REF1}$ are developed on the REF input terminals of comparators 250 and 251, respectively. These reference voltages $V_{REF0}$ and $V_{REF1}$ are directly related to the programmed threshold voltages of NVM reference cells 340 and 341. As described in more detail below, the threshold voltages of NVM reference cells 340–341 are separately programmed to account for the random voltage offsets 360–361, respectively, in comparators 250–251. Thus, if offset voltage 360 is different than offset voltage 361, then the programmed threshold voltage of NVM reference cell 340 will be different than the programmed threshold voltage of NVM reference cell 341. As a result, the reference voltage $V_{REF0}$ will be different than the reference voltage $V_{REF1}$.

More specifically, the threshold voltage of NVM reference cell 340 is programmed such that the reference voltage $V_{REF0}$ generated during a read operation is equal to a desired reference voltage ($V_{REF}$) to be applied to the REF input terminal of ideal comparator 350 minus internal voltage offset 360 ($V_{OFF[0]}$). Thus, during a read condition, the voltage provided to the REF input terminal of comparator 250 (i.e., $V_{REF0}$) is equal to $V_{REF}-V_{OFF[0]}$. The voltage passed to the REF input terminal of ideal comparator 350 is therefore equal to $V_{REF}$.

Similarly, the threshold voltage of NVM reference cell 341 is programmed such that the reference voltage $V_{REF1}$ generated during a read operation is equal to a desired reference voltage ($V_{REF}$) to be applied to the REF input terminal of ideal comparator 351 minus internal voltage offset 361 ($V_{OFF[1]}$). Thus, during a read condition, the voltage provided to the REF input terminal of comparator 251 (i.e., $V_{REF0}$) is equal to $V_{REF}-V_{OFF[1]}$. The voltage passed to the REF input terminal of ideal comparator 351 is therefore equal to $V_{REF}$.

In this manner, ideal comparators 350 and 351 both compare their respective received read voltages R[0] and R[1] with the same reference voltage $V_{REF}$. NVM reference blocks 242–247 and corresponding comparators 252–257 are configured in the same manner as NVM reference blocks 240–241 and corresponding comparators 250–251. As a result, all of the read voltages R[7:0] are compared with the same reference voltage $V_{REF}$. As a result, consistent results are obtained for read operations across different comparators.

During production, each of the NVM reference cells in NVM reference blocks 240–247 are programmed in the following manner. The following example describes the programming of NVM reference cell 340. It is understood that the other NVM reference cells are programmed in the same manner.

The threshold voltage of NVM reference cell 340 is initially programmed in the following manner. First, the desired reference voltage $V_{REF}$ is determined. This reference voltage $V_{REF}$ is determined by selecting a voltage to be used to differentiate between a logic high data value and a logic low data value during a read operation. This reference voltage $V_{REF}$ may be selected in view of the known design of NVM memory system 200. For example, if a read operation on an erased NVM cell is expected to result in a read voltage R[0] of 1 Volt, and a read operation on a programmed NVM cell is expected to result in a read voltage of 2 Volts, then the reference voltage $V_{REF}$ may be set to a voltage of 1.5 Volts. In the described embodiment, the same reference voltage $V_{REF}$ is selected for all of comparators 250–257, although this is not necessary.

NVM reference cell 340 is then subjected to a programming operation by hot electron injection. In other embodiments, other types of programming, such as Fowler-Nordheim tunneling, may be used. In the described example, a first programming voltage of 9 Volts is applied to the gate of NVM reference cell 340, and a second programming voltage of 0 Volts is applied to the source of NVM reference cell 340 through multiplexer path 320B, and a third programming voltage of 4 Volts is applied to the drain of NVM reference cell 340 through multiplexer path 320A. This programming condition is maintained for about 1 microsecond.

A read verify operation is then performed as follows. The predetermined reference voltage $V_{REF}$ is applied to the SIG input terminal of comparator 250 (and thereby to the SIG input terminal of ideal comparator 350). This reference voltage $V_{REF}$ can be applied to the SIG input terminal of comparator 250 in various ways, including but not limited to, a routing this reference voltage $V_{REF}$ from an input pad of system 200 through a switch which is coupled to the SIG input terminal of comparator 250. The applied reference voltage $V_{REF}$ can be in the form of a DC or AC voltage.

NVM reference cell 340 is then subjected to read verify conditions, wherein the gate of reference cell 340 is held at a voltage slightly higher than the normal read word line voltage $V_{RWL}$, and the source of reference cell 340 is held at a read voltage of 2 Volts.

Because the initial programming pulse is relatively small, the resulting read verify voltage applied to the REF input terminal of comparator 250 should result in a voltage applied to the REF input terminal of ideal comparator 350 that is less than the predetermined reference voltage $V_{REF}$. As a result, comparator 250 provides an output signal that indicates that the voltage on the REF input terminal of comparator 250 is less than the predetermined reference voltage $V_{REF}$ applied to the SIG input terminal of comparator 250. In response, a second programming pulse is applied to NVM reference cell 340.

During the second programming operation, the voltage on the drain of reference cell 340 is increased by a small amount. For example, the voltage applied to the drain of reference cell 340 during the second programming operation may be equal to 4.1 Volts, or 0.10 Volts greater than during the first programming operation. In other embodiments, the programming voltage applied to the drain of reference cell 340 can be increased by other incremental voltages. The incremental voltage is selected depending on the desired resolution of the programmed threshold voltage of NVM reference cell 340. The second programming operation is performed for the same duration as the first programming operation, or 1 micro-second.

After the second programming operation is performed, a second read verify operation is performed in the manner described above. If the resulting voltage applied to the REF input terminal of ideal comparator 350 is less than the $V_{REF}$ voltage applied to the SIG input terminal of ideal comparator 350, then another programming operation is performed, with the drain voltage of reference cell 340 being increased by the incremental voltage. If the resulting voltage applied to the REF input terminal of ideal comparator 350 is greater than the $V_{REF}$ voltage applied to the SIG input terminal of ideal comparator 350, then the programming of NVM reference cell 340 is complete.

In this manner, the threshold voltage of NVM reference cell 340 is programmed such that when NVM reference cell 340 is subjected to read conditions, the voltage applied to the REF input terminal of comparator 250 will be equal to the predetermined reference voltage $V_{REF}$, minus the offset voltage $V_{OFF[0]}$ of comparator 250. As a result, the voltage applied to the REF input terminal of ideal comparator 350 will be equal to the predetermined reference voltage $V_{REF}$ during read operations.

In the foregoing manner, the voltage offset $V_{OFF[0]}$ of comparator 250 affects the amount of charge, and thereby the threshold voltage, programmed into NVM reference cell 340. If comparator 250 has a positive offset voltage $V_{OFF[0]}$, then the programming operation is stopped relatively early, such that the amount of charge stored in NVM reference cell 340 (and the resulting threshold voltage of NVM reference cell 340) is relatively low. Conversely, if comparator 250 has a negative offset voltage $V_{OFF[0]}$, then the programming operation will be stopped relatively late, such that the amount of charge stored in NVM reference cell 340 (and the resulting threshold voltage of NVM reference cell 340) is relatively high. In this manner, voltage offset 360 results in an inverse offset in the threshold voltage of NVM reference cell 340 during the programming operation.

During a read operation, comparator 250 compares the content of memory cell 310 to the content of NVM reference cell 340. The threshold voltage offset programmed into NVM reference cell 340 and the comparator offset 360 are complementary, thereby canceling each other.

NVM reference cell 341 is independently programmed in the same manner as NVM reference cell 340. Thus, when programming NVM reference cell 341, the same reference voltage $V_{REF}$ is applied to the SIG input terminal of comparator 251. However, the threshold voltage programmed into NVM reference cell 341 is determined in response to voltage offset 361 in comparator 241. That is, the threshold voltage programmed into NVM reference cell 341 is referenced to the offset voltage $V_{OFF[1]}$. The NVM reference cells (not shown) located in reference voltage generation circuits 242–247 are programmed in the same manner as NVM reference cells 340 and 341.

In this manner, each of comparators 250–257 is optimized to accurately read the data stored in NVM cells of the corresponding NVM array sections 210–217.

Although the invention has been described in connection with several embodiments, it is understood that this invention is not limited to the embodiments disclosed, but is capable of various modifications, which would be apparent to a person skilled in the art. For example, the present invention is applicable to various types of non-volatile memory cells, including 2-bit non-volatile memory cells. Thus, the invention is limited only by the following claims.

What is claimed is:

1. A non-volatile memory (NVM) system comprising:
a first array of NVM cells arranged in rows and columns;
a first comparator having a signal input terminal and a reference input terminal, wherein the first comparator exhibits a first voltage offset;
a decoder for coupling one of the NVM cells of the first array to the signal input terminal of the first comparator during a read operation; and
a first NVM reference cell coupled to the reference input terminal of the first comparator during the read operation, wherein the first NVM reference cell has a first threshold voltage that corresponds with the first voltage offset.

2. The NVM system of claim 1, further comprising:
a second array of NVM cells arranged in rows and columns;
a second comparator having a signal input terminal and a reference input terminal, wherein the second comparator exhibits a second voltage offset;
a decoder for coupling one of the NVM cells of the second array to the signal input terminal of the second comparator during a read operation;
a second NVM reference cell coupled to the reference input terminal of the second comparator during the read operation, wherein the second NVM reference cell has a second threshold voltage that corresponds with the second voltage offset, the second threshold voltage being different than the first threshold voltage.

3. A non-volatile memory (NVM) system comprising:
an array of NVM cells arranged in rows and columns;
a column decoder coupled to the array, wherein the column decoder is configured to route a set of N read output voltages from NVM cells of the array during a read operation, where N is an integer greater than one;
a set of N comparators, each having a signal input terminal coupled to receive a corresponding one of the N read output voltages, each of the N comparators having a corresponding offset voltage; and
a set of N reference blocks, each generating a distinct reference voltage that is applied to a reference input terminal of a corresponding one of the comparators during a read operation, wherein the distinct reference voltage generated by each of the reference blocks corresponds with the offset voltage of the corresponding one of the comparators.

4. A method of operating a non-volatile memory (NVM) system, the method comprising:
subjecting a first NVM cell to read conditions, thereby generating a first read voltage representative of a state of the first NVM cell;
applying the first read voltage to a signal input terminal of a first comparator having a first offset voltage;
programming a first NVM reference cell to have a first threshold voltage in response to the first offset voltage;
subjecting the first NVM reference cell to read conditions, thereby generating a first reference voltage equal to a desired reference voltage minus the first offset voltage; and
applying the first reference voltage to a reference terminal of the first comparator.

5. The method of claim 4, further comprising:
subjecting a second NVM cell to read conditions, thereby generating a second read voltage representative of a state of the second NVM cell;
applying the second read voltage to a signal input terminal of a second comparator having a second offset voltage;
programming a second NVM reference cell to have a second threshold voltage in response to the second offset voltage;

subjecting the second NVM reference cell to read conditions, thereby generating a second reference voltage equal to the desired reference voltage minus the second offset voltage; and applying the second reference voltage to a reference terminal of the second comparator.

6. The method of claim 4, wherein the step of programming the first NVM reference cell further comprises:

(a) programming the first NVM reference cell using a reference programming voltage, wherein the reference programming voltage is significantly less than a full programming voltage;

(b) performing a read verify operation on the NVM reference cell, thereby creating a read verify voltage;

(c) applying the read verify voltage to the reference input terminal of the first comparator;

(d) applying the desired reference voltage to the signal input terminal of the first comparator; and (e) repeating steps (a)–(d), incrementally increasing the reference programming voltage each time that step (a) is performed, until an output signal provided by the first comparator changes states.

7. A method of operating a non-volatile memory (NVM) system comprising:

routing a set of read output voltages from a set of NVM cells during a read operation;

providing the each of the read output voltages to a signal input terminal of a corresponding comparator, wherein each of the comparators has a corresponding offset voltage;

generating a set of distinct reference voltages; and applying each of the distinct reference voltages to a reference input terminal of a corresponding one of the comparators, wherein each of the distinct reference voltages corresponds with the offset voltage of the corresponding one of the comparators.

8. A non-volatile memory (NVM) system comprising:

an array of NVM cells arranged in rows and columns;

a column decoder coupled to the array, wherein the column decoder is configured to route a set of N read output voltages from NVM cells of the array during a read operation, where N is an integer greater than one;

a set of N comparators, each having a signal input terminal coupled to receive a corresponding one of the N read output voltages, each of the N comparators having a corresponding random internal voltage offset; and a set of N reference blocks, each generating a distinct reference voltage that is applied to a reference input terminal of a corresponding one of the comparators during a read operation, wherein each of the reference blocks includes an NVM reference cell that has been programmed to generate the distinct reference voltage for the corresponding reference block in response to the random internal voltage offset of the corresponding comparator.

9. A method of operating a non-volatile memory (NVM) system comprising:

routing a set of read output voltages from a set of NVM cells during a read operation;

providing the each of the read output voltages to a signal input terminal of a corresponding comparator, wherein each of the comparators has a corresponding random internal voltage offset;

programming a plurality of NVM reference cells, wherein each of the NVM reference cells is programmed to generate a distinct reference voltage in response to the random internal offset voltage of a corresponding one of the comparators; and applying each of the distinct reference voltages to a reference input terminal of the corresponding one of the comparators.

* * * * *